United States Patent [19]

Freeman et al.

[11] 3,995,172

[45] Nov. 30, 1976

[54] ENHANCEMENT-AND DEPLETION-TYPE FIELD EFFECT TRANSISTORS CONNECTED IN PARALLEL

[75] Inventors: Leo Boyes Freeman; Robert James Incerto, both of Poughkeepsie; Joseph Anthony Petrosky, Jr., Wappingers Falls, all of N.Y.

[73] Assignee: International Business Machines Corporation, Armonk, N.Y.

[22] Filed: June 5, 1975

[21] Appl. No.: 583,926

[52] U.S. Cl. .................................. 307/205; 307/214; 307/216; 307/238; 307/304; 340/173 FF; 357/23
[51] Int. Cl.² .................. H03K 19/08; H03K 19/20; H03K 19/40; G11C 11/40
[58] Field of Search ........... 307/205, 214, 216, 238, 307/304, 270, 279; 357/23; 340/173 FF

[56] References Cited

UNITED STATES PATENTS

| | | | |
|---|---|---|---|
| 3,430,112 | 2/1969 | Hilbourne | 357/23 |
| 3,694,673 | 9/1972 | Au | 307/205 X |
| 3,775,693 | 11/1973 | Proebsting | 307/205 X |

OTHER PUBLICATIONS

Kemerer, "Storage Cell Using Double-Threshold Field-Effect Transistors;" *IBM Tech. Discl. Bull.;* vol. 14, No. 4, pp. 1077-1078; Sept. 1971.

*Primary Examiner*—John S. Heyman
*Assistant Examiner*—Larry N. Anagnos
*Attorney, Agent, or Firm*—Thomas F. Galvin

[57] ABSTRACT

A circuit comprising the parallel connection of an enhancement-and a depletion-type FET which exhibits reduced power and improved performance for both logic as well as memory circuits.

8 Claims, 19 Drawing Figures

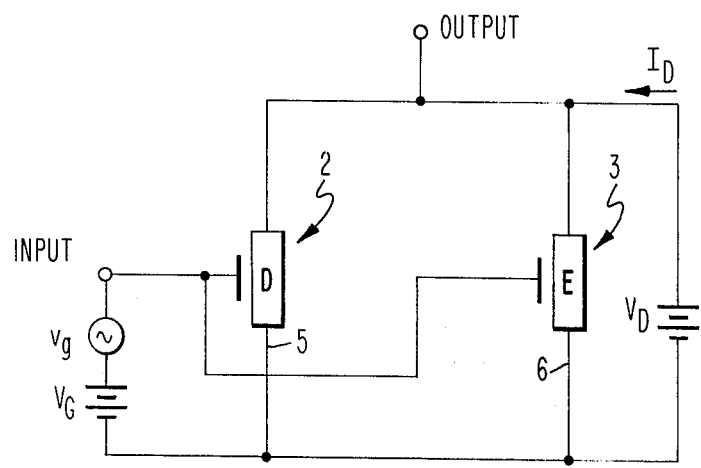
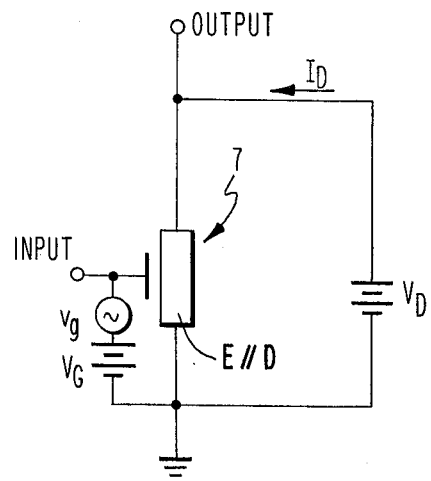
FIG. 1　　　　　　　　FIG. 2
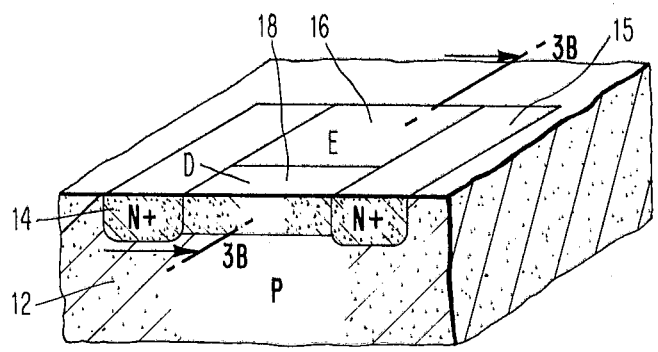
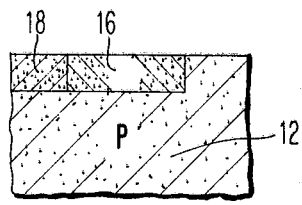
FIG. 3A　　　　　　　　FIG. 3B

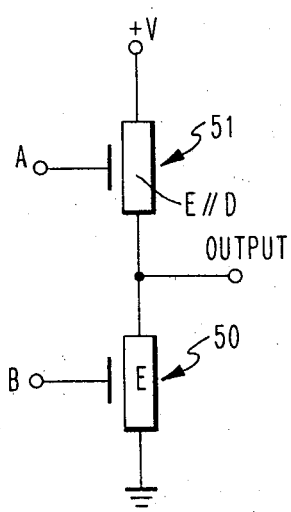
FIG. 9
| A | B | OUTPUT |
|---|---|--------|
| 1 | 1 | 1 |
| 1 | 0 | 1 |
| 0 | 1 | 0 |
| 0 | 0 | 1 |
FIG. 10
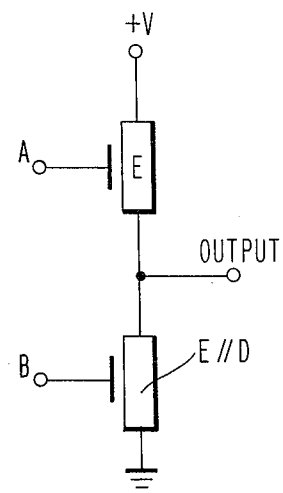
FIG. 11
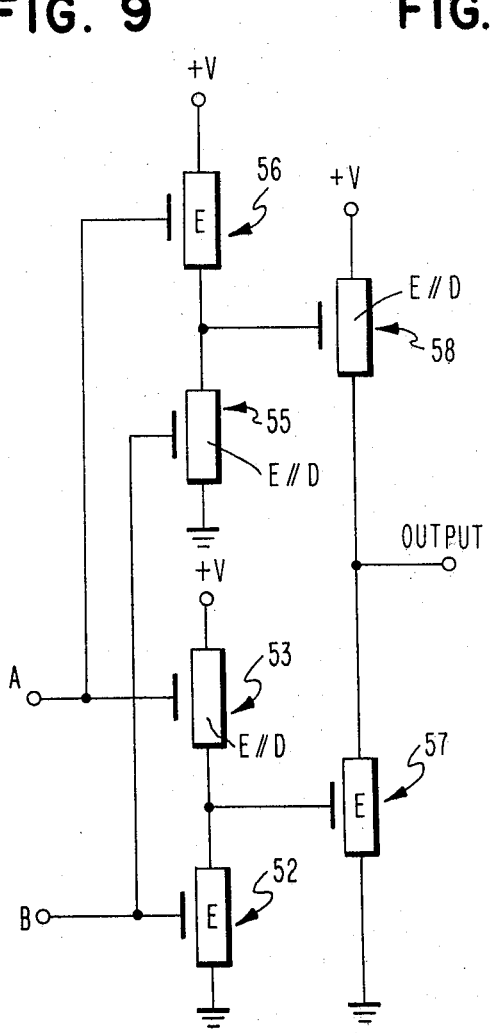
FIG. 13
| A | B | OUTPUT |
|---|---|--------|
| 1 | 1 | 0 |
| 1 | 0 | 1 |
| 0 | 1 | 0 |
| 0 | 0 | 0 |
FIG. 12
| A | B | OUTPUT |
|---|---|--------|
| 1 | 1 | 0 |
| 1 | 0 | 1 |
| 0 | 1 | 1 |
| 0 | 0 | 0 |
FIG. 14

ENHANCEMENT-AND DEPLETION-TYPE FIELD EFFECT TRANSISTORS CONNECTED IN PARALLEL

BACKGROUND OF THE INVENTION

1. Field of the Invention

This invention relates to field effect transistors utilizing enhancement-and depletion type devices.

2. Description of the Prior Art

Field effect transistors have enjoyed widespread use in various industries such as the data processing industry, particularly as large scale integrated circuits for around a decade. As compared to bipolar circuits, the main competitors of field effect transistors, the latter are much less expensive to fabricate. However, circuit operation with field effect transistors is a good deal slower than is achievable with bipolar circuits and a relatively higher magnitude of supply voltage is required to operate the field effect transistor circuits.

Various types of FET fundamental circuits have been proposed as solutions to these problems. The basic circuit is an inverter which may comprise, for example, a resistive type load interconnecting the drain voltage to the inverter output and an enhancement-type transistor connecting the output to the source of voltage. Due to the impracticality of providing a diffused region having a resistance sufficiently large to provide a low level of power dissipation without utilizing an enormous amount of semiconductor area, an enhancement-type field effect transistor in which the gate is connected to the drain supply voltage has been utilized as a substitute for the resistor. The disadvantage of this circuit is that the output voltage is limited to the drain voltage less the threshold voltage of the load transistor. In addition the output current of the load device decreases very rapidly as the magnitude of the voltage on the output, i.e., the source of the load transistor, increases.

Another family of circuits which are well known to those of skill in the art is the complementary inverter utilizing an N-channel enhancement-type transistor connected to the negative voltage supply and a P-channel enhancement-type transistor connected to the positive voltage supply, with the common drains being the output. This type of circuit uses substantial power only when the devices are switched and require only a single supply voltage. Their use is widespread in low power, relatively slow systems such as calculators, portable data buffers, and electronic watches. However, the use of transistors of opposite channel type necessitates an unusually large area on an integrated circuit chip due to the requirements of isolation between the devices. In addition, more processing steps are required, thereby significantly increasing fabrication costs.

More recently, circuit families have been proposed which employ as an inverter an enhancement-type field effect transistor (E-FET) connected between source and drain supply voltages with a depletion-type transistor (D-FET) as a load.

As is well known to circuit designers, an enhancement-type FET has substantially zero channel conductivity for zero gate-source voltage; the channel conductivity may be increased by applying a gate-source voltage of appropriate value. For an N-channel enhancement-type FET, a more positive gate-source voltage, denoted $V_G$, or $V_{GS}$, increases channel conductivity. A depletion-type FET, on the other hand, has appreciable channel conductivity for zero $V_G$; the channel conductivity may be increased or decreased according to the polarity of the $V_{GS}$. For an N-channel depletion type FET, a more positive $V_{GS}$ increases channel conductivity; conduction continues until a predetermined negative $V_{GS}$ is applied.

The combination of an E-FET and a D-FET as an inverter is superior to an inverter employing E-FET's only, because the efficiency is higher and the transient response faster. It has been found that the current through the D-FET remains substantially constant as the output voltage transitions go toward the drain supply voltage, thus providing significantly greater switching speeds. The D-FET can also be made significantly smaller than an E-FET used for the same purpose, particularly where additional switching speed is not required.

As will be understood by those working in this field; such inverter circuits are seldom used individually; ordinarily, combinations of such circuits are formed as memory or logic circuits. Such combinations have revealed problems which have heretofore not been satisfactorily resolved, as for example, the power required and the performance obtainable.

For example, the operation of field effect transistor digital circuits is highly dependent on the ratio of current flowing through the transistors when the devices are supplied with a logic 1 or 0 input signa A typical line driver features an output stage comprising a series-connected D-FET and E-FET. The input signal is applied to the E-FET; and the D-FET input is controlled by a series connection of another E-FET and a D-FET load device. The input signal is also applied to the gate of the latter E-FET. The rise time and delay of the circuit is determined by the current generated by the output D-FET. To speed up circuit operation the output D-FET can be made wider, but this increases the power utilized in the low output state.

As another example, a four-device, static memory cell has been developed which utilizes a pair of E-FET's as a cross-coupled storage cell and a pair of double-threshold FET's functioning both as load as well as I/O devices. Such a memory cell is described in the publication by D. W. Kemerer entitled "Storage Cell Using Double-Threshold Field-Effect Transistors," IBM Technical Disclosure Bulletin, Vol. 14, No. 4, September 1971, pages 1077–78. This type of cell is superior to the more common six device static cells in that the chip space allocation required for each cell is considerably reduced through the use of double-threshold field-effect transistors. All of the devices described in the publication are of the enhancement type in that the devices are normally non-conducting until an appropriate bias is placed on their gate electrodes. The switching speed of this type of array is too low to be useful in commercially acceptable memory arrays. In addition, the biasing for the word line during cell operation is more complicated than for standard cells.

SUMMARY OF THE INVENTION

It is therefore an object of the present invention to improve the operation of circuits using field effect transistors.

It is yet another object of our invention to achieve this result economically by using standard integrated semiconductor structures and fabrication techniques.

In accordance with these and other objects of our invention, we have found that the parallel connection of a depletion-type and an enhancement-type field effect transistors reduces the power requirements and/or increases the speed of enhancement-/depletion-type circuits. In all the cases the power-performance figure is improved.

In one preferred embodiment of our invention, the performance of an inverter circuit utilizing a push-pull output stage is improved by paralleling an enhancement-type FET with the depletion-type FET used as the output device.

In another embodiment the power-performance figure of a four-device memory cell is improved by utilizing a parallel connection of enhancement-and depletion-type devices.

In yet other embodiments, the power-performance factor of various types of logic circuits are improved by use of our basic circuit.

BRIEF DESCRIPTION OF THE DRAWINGS

FIG. 1 is a schematic circuit diagram of our paralleled depletion- and enhancement-type devices in accordance with the present invention.

FIG. 2 is a schematic circuit diagram in which the enhancement- and depletion-type devices are illustrated as a single device.

FIG. 3A and 3B are perspective and side views, respectively, of a single semiconductor device comprising both an enhancement-as well as a depletion-type FET.

FIG. 9–14 are circuit diagrams accompanied by truth tables of improved logic circuits in accordance with our invention.

DESCRIPTION OF THE PREFERRED EMBODIMENT

Figure 4A:
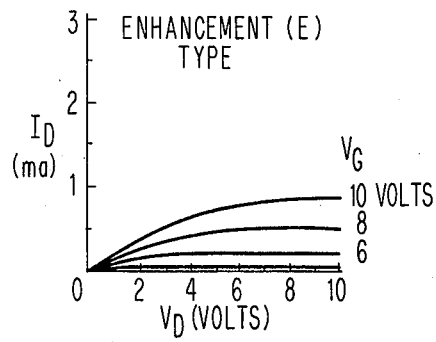
FIGS. 4A–4C are graphs of the drain-source current, $I_D$, versus the drain-source voltage, $V_D$, which illustrate the improvement of our inventive circuit as compared to the characteristics of individual enhancement- and depletion-type FET's.

Turning now to FIG. 1, the basic circuit of our invention is illustrated as the parallel connection of depletion-type FET 2 (D-FET) and an enhancement-type 3 (E-FET). Both are N-channel, although P-channel transistors could also be used. The source electrodes of the depletion- and enhancement-type transistors, denoted by the numerals 5 and 6, respectively, are connected to the negative side of the circuit. The drain electrodes are connected to the positive side of the circuit and also to the OUTPUT line. For P-channel FET's, the voltage polarity would be reversed. The gate electrodes are connected in common to the INPUT of the circuit. The gate electrodes of each of the depletion- and enhancement-type transistors remain active, i.e., neither of the gate electrodes are shorted to the source or drain electrodes. The drain-source voltage of both devices is denoted as $V_D$; and the gate-source voltage is denoted as $V_G$. The signal to the INPUT of the circuit is denoted as $v_g$. The output signal is the current $I_D$.

The basic circuit shown in FIG. 1 may be used as a stand-alone circuit but will most often be used as a part of a larger number of components. In such circuits the location and source of reference potentials $V_G$ and $V_D$ will vary. However, the basic arrangement of the transistors with respect to each other is constant: the gate, source and drain electrodes of one device are connected, respectively, to the gate, source and drain electrodes of the other; and there is no connection between the gate electrodes and the drain or source electrodes.

FIG. 2 shows the paralleled depletion-and enhancement-type FET's as substantially a single device 7, represented by the symbol E//D. The embodiment of such a circuit as an N-channel semiconductor integrated device is illustrated in FIGS. 3A and 3B. The source and drain regions of the device, denoted as 14 and 15, respectively, comprise N+ type diffusions in a P type substrate 12. The device is different from standard field effect transistors in that it has two separate channel regions denoted as 16 and 18. Region 16 serves as the enhancement-type portion of the device. This portion has a relatively low resistivity as compared to region 18 and has a threshold voltage $V_T$, which is greater than 0 volts. Region 18, on the other hand, has a relatively low doping level so as to have a threshold voltage, $V_T$, which is less than 0 volts.

The fabrication of the device shown in FIGS. 3A and 3B can be achieved by standard semiconductor processing techniques. Depletion region 18 of the channel is preferrably formed by ion implanting an N-type dopant such as arsenic or phosphorus into the region to decrease the threshold voltage, $V_T$. Enhancement region 16 of the channel may have the same doping level as substrate 12; or a P-type dopant such as boron may be ion implanted to raise the threshold voltage. Numerous other techniques for fabricating the device of FIG. 3A will occur to those of skill in the semiconductor art.

Although FIGS. 3A and 3B refer to N-channel field effect transistors, the invention also contemplates the use of P-channel field effect transistors.

Figure 4B:
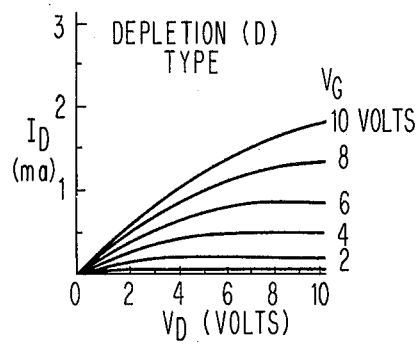
Figure 4C:
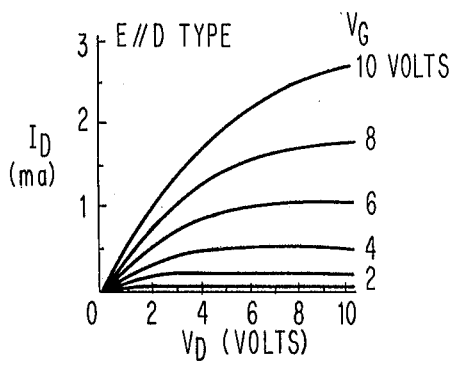

FIGS. 4A–4C and 5A–5C compare the typical characteristic curves of enhancement-and depletion-type devices with the characteristics of the parallel-connected devices according to our invention. FIGS. 4A–4C show the drain current $I_D$, versus the drain-source voltage $V_D$ for selected gate-drain voltages, $V_G$.

FIGS. 4A and 4B are characteristic curves for standard E-FET's and D-FET's, respectively, which are well known to those of skill in the semiconductor art. For a given $V_D$ and $V_G$, an enhancement-type device has a lower drain-to-source current, $I_D$, than a similarly-manufactured depletion-type device. In addition, the current swing due to a change in $V_G$ at a given $V_D$ is greater for a D-FET and an E-FET.

For the parallel connection of a D-FET and an E-FET according to our invention, not only is the current much greater for a given $V_G$ and $V_D$, but the current swing about $V_G$ is also substantially greater. Because the current through the paralleled devices is larger than for the devices individually, switching across an output load is much faster.

Figure 5A:
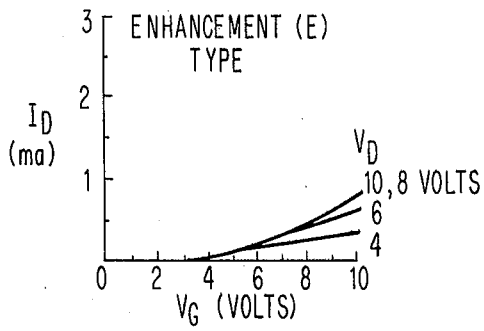
FIGS. 5A–5C are graphs of $I_D$ versus the gate-source voltage, $V_G$, which also illustrate the improvement.
Figure 5B:
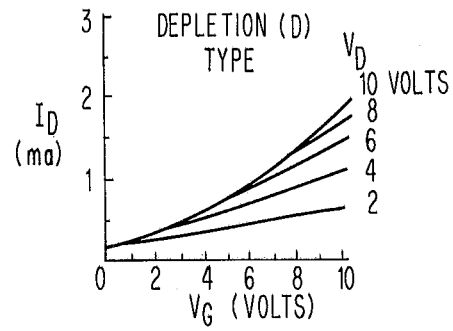
Figure 5C:
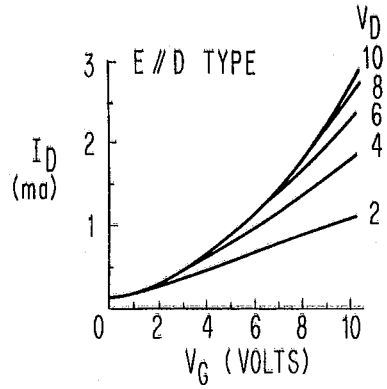

In the FIGS. 5A–5C, it will be noted that at smaller values of $V_G$ and $V_D$, the current through the E//D type device equals that of the depletion-type device shown in FIG. 5B. This means that the power dissipated by the E//D FET at low gate voltages is equivalent to that of the D-FET alone, despite the higher switching speed of the paralleled device.

Figure 6:
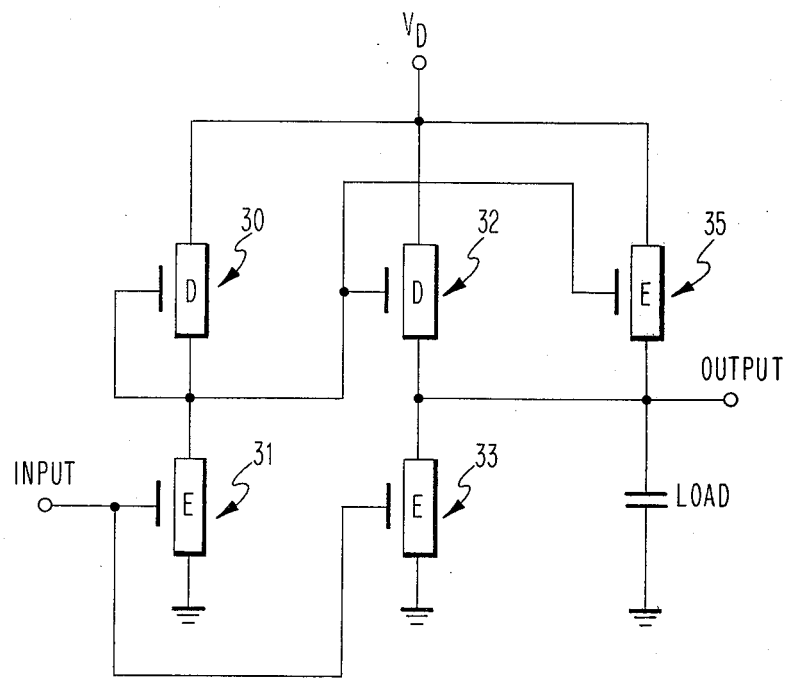
FIG. 6 is a schematic circuit diagram of an improved line driver switching circuit in accordance with our invention.

FIG. 6 illustrates a logic inverter according to our invention which may be used as a line driver in field effect transistor circuits. The novel connection in FIG. 6 comprises the parallel connection of a D-FET 32 and E-FET 35. The connection of D-FET's 30 and 32 and E-FET's 31 and 33, without E-FET 35, is a known inverter switching circuit.

Transistors 30 and 31 are connected in series between a drain voltage $V_D$ and a source voltage indicated by the conventional symbol of ground potential. The source electrode of D-FET 30 is electrically common with its gate and the gate of D-FET 32. The INPUT to the circuit is connected to the gates of E-FET's 31 and 33. The OUTPUT of the circuit is connected to drive another circuit (not shown) having the load capacitance indicated. The improvement to this circuit comprises the addition of E-FET 35 having its drain, source and gate directly connected to the drain, source and gate, respectively, of D-FET 32.

Figure 7:
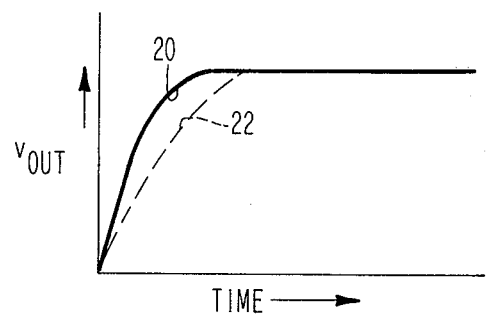
FIG. 7 is a graph of voltage with respect to time at the output node of the circuit shown in FIG. 6.

The operation of the circuit in FIG. 6 is best considered by reference also to FIG. 7, which is a graph of the voltage at the output of the circuit, $V_{out}$, during the switching period with respect to time. Dotted line 22 illustrates the operation of the circuit of FIG. 6 without the aforementioned connection of E-FET 35; whereas line 20 illustrates circuit operation with the connection of E-FET 35 as shown in FIG. 6.

Assuming that the signal at the INPUT line goes positive, i.e., a logic 1, E-FET 31 is rendered conductive and causes current to flow from $V_D$ through D-FET 30 to ground. The input signal also causes E-FET 33 to turn on, while E-FET 35 is rendered nonconductive due to the path from its gate electrode through E-FET 31 to ground. D-FET 32, by its nature, is always conductive to some extent; and current flows from $V_D$ through D-FET 32 and E-FET 33 to ground. At this point then, the potential at the OUTPUT is slightly above ground, say around 0.1 to 0.4 volts. The power dissipated in the circuit when the input signal is a logic 1 equals the power supply voltage, $V_D$, times whatever current is flowing through the D-FET's 30 and 32. The power dissipated by E-FET's 31 and 33 is minimal because both are turned on by the input signal. Similarly, no power is dissipated through E-FET 35 because it is turned off. Thus, the circuit in FIG. 6 utilizes no more power with E-FET 35 in circuit than it would if E-FET 35 were not in the circuit, as in the prior art.

When the signal at the INPUT changes from a positive to a zero potential, i.e., logic 1 to logic 0, both E-FET's 31 and 33 are turned off. The gate of D-FET 32 rises quickly to $V_D$, the path of $V_D$ being through D-FET 30 to the gate of D-FET 32. This turns D-FET 32 on hard and pulls the load capacitance up to $V_D$. E-FET 35 also turns on and the current through it is added to that of D-FET 32 in charging the load. This increases the output charging rate until the output voltage denoted as $V_{out}$ in FIG. 7 rises to the point where $V_{GS}$ (or $V_G$) for E-FET 35 becomes less than its threshold voltage $V_T$. At that point the output is sustained by D-FET 32 only. The graph in FIG. 7 illustrates the output potential $V_{out}$ versus time for the circuit with and without E-FET 35. Line 20, which is the output potential for the circuit containing E-FET 35, shows a markedly faster rise time as compared to line 22 which is output potential for the same circuit but without the connection of E-FET 35 therein.

Figure 8:
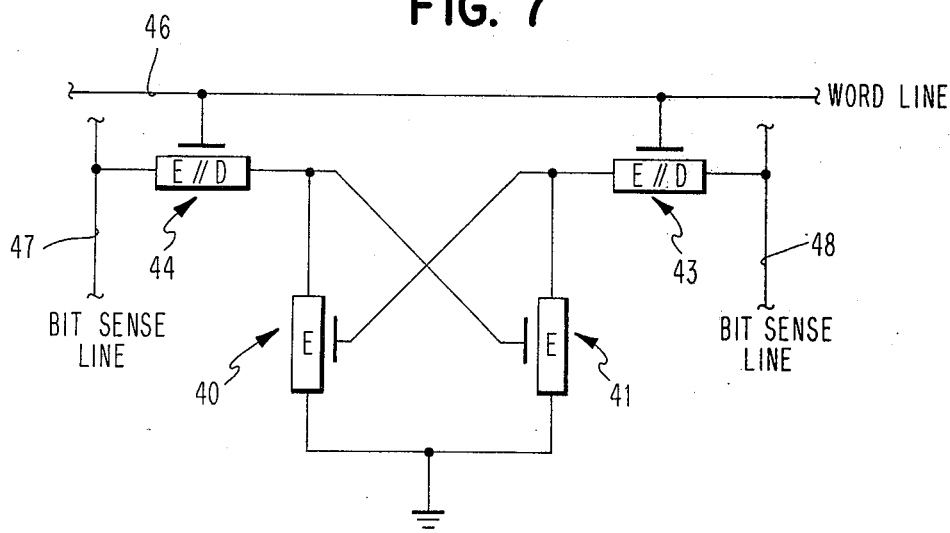
FIG. 8 is a schematic circuit diagram of an improved storage cell in accordance with our invention.

FIG. 8 is an improved static cross-coupled memory cell in which the output and I/O devices 43 and 44 are paralleled D-and-E-FET's (E//D) according to our invention. Devices 40 and 41 are enhancement-type field effect transistors in a cross-coupled configuration which comprise the storage cell itself. The combined E//D FET devices 43 and 44 provide a load as well as input/output gating functions.

During standby operation, word line 46 is at a low potential, say $V_{wl}$=0 volts, and bit-sense lines 47 and 48 are high, say $V_{bs}$=+5 volts. One of the storage devices 40 and 41 is conductive while the other is non-conductive. Therefore, current is flowing from one of the bit-sense lines through one of the E//D devices and its associated E-FET storage device to ground. For example, if E-FET 41 is conductive, current is flowing from bit-sense line 48 through device 43 and E-FET 41 to ground. Because E-FET 41 is conductive to ground, the ground potential holds E-FET 40 in the "off" state. The depletion portions of E//D FET's 44 and 43 are in their low conductive state because word line 46 is held at 0 volts. The cell is held in the energized state by current flowing through the depletion portion only.

The cell is read and written by current flowing through both portions of the E//D FET's.

During a READ operation, for example, word line 46 is raised to around 5 volts, and the potential on the bit-sense lines 47 and 48 remains high. Depending on which storage E-FET 40 or 41 is conductive, the E//D FET associated with it also conducts. The current is sensed as a bit 0 or 1 on the associated bit-sense line.

During a WRITE operation, word line 46 remains at 5 volts and either one of the bit-sense line 47 or 48 is lowered to set the cross-coupled storage cell in a 0 or 1 state.

Because the cell is read and writen by current flowing through the E//D FET's 43 or 44, both the signal-to-noise ratio as well as the power-performance figure are very high. Both are determined by the ratio:

$$I_D \ (V_{wl}=5 \text{ volts}) \ / \ I_D \ (V_{wl}=0 \text{ volts}) \qquad (1)$$

This ratio is many times larger for E//D FET's than if D-FET's alone were used as the I/0/load cells.

The logic circuits illustrated in FIG. 9–14 illustrate the use of our E//D FET's as a replacement for the standard elements in such circuits. Our improved logic circuits demonstrate the same enhanced driving capabilities as described previously, as well as other advantages.

The logic circuit in FIG. 9 performs the logical OR function of $A + \overline{B}$ shown in the Truth Table in FIG. 10. In FIG. 11, the devices are swapped to construct a circuit performing the logical AND function of $A \cdot \overline{B}$ shown in the Truth Table of FIG. 12.

The circuits in FIGS. 9 and 11 are combined with an added output stage in FIG. 13 to form an EXCLUSIVE-OR function having the Truth Table shown in FIG. 14 circuit. To perform this function using conventional enhancement-and depletion-type devices ordinarily requires eleven tranistors. Our circuit requires only six (nine if the E//D FET is considered as two devices).

The conventional EXCLUSIVE-OR circuit also requires three stages of delay, whereas the circuit in FIG. 13 requires only two such stages. This feature, combined with the enhanced driving capabilities of the E//D FET's, provides a significant improvement in the power-performance product. Our invention can be extended to include a more complete family of logic circuits offering the same advantages.

Although the invention has been described with a certain degree of particularity, it is understood that the present disclosure has been made only by way of example and that numerous changes in details of construction the combination and arrangements of parts, and the method of operation may be made without departing from the spirit and the scope of the invention as hereinafter claimed.

We claim:

1. A logic circuit for performing the EXCLUSIVE-OR function comprising:
   a first depletion-type field effect transistor and a first enhancement-type field effect transistor connected in parallel;
   a second enhancement-type field effect transistor connected in series with the first paralleled connection;
   the common terminal of the first series connection comprising a first output terminal;
   means for applying a first reference potential across the first series connection;
   means for applying sources of first and second input signals to the gate electrodes of said first paralleled connection and said enhancement-type field effect transistor, respectively;
   a second depletion-type field effect transistor and a third enhancement-type field effect transistor connected in parallel;
   a fourth enhancement-type field effect transistor connected in series with the second paralleled connection;
   the common terminal of the second said series connection comprising a second output terminal;
   means for applying said first reference potential across said second series connection, the polarity of said potential being reversed with respect to that of said first series connection;
   means for applying said sources of said first and second input signals to the gate electrode of said fourth enhancement-type field effect transistor and said second paralleled connection, respectively;
   a third depletion-type field effect transistor and a fifth enhancement-type field effect transistor connected in parallel;
   a sixth enhancement-type field effect transistor connected in series with the third paralleled connection;
   the common terminal of the third series connection comprising an EXCLUSIVE-OR output terminal;
   means for applying said first reference potential across said third series connection;
   said first and second output terminals connected to the gate electrodes of said third paralleled connection and said sixth enhancement-type field effect transistor, respectively.

2. A logic circuit comprising:
   an N-channel depletion-type field effect transistor and an N-channel enhancement-type field effect transistor connected in parallel;
   a second N-channel enhancement-type field effect transistor connected in series with said paralleled connection;
   means for applying a reference potential across said series connection;
   means for applying input signals to the gate electrodes of said field effect transistors;
   the positive side of said reference potential being connected to the drain terminal of said paralleled transistors;
   whereby said circuit performs the logical OR function of $A+B$.

3. A logic circuit comprising:
   an N-channel depletion-type field effect transistor and an N-channel enhancement-type field effect transistor connected in parallel;
   a second N-channel enhancement-type field effect transistor connected in series with said paralleled connection;
   means for applying a reference potential across said series connection;
   means for applying input signals to the gate electrodes of said field effect transistors;
   the positive side of said reference potential being connected to the drain terminal of said second enhancement-type field effect transistor;
   whereby said circuit performs the logical AND function of $A \cdot B$.

4. In a memory cell including cross-coupled enhancement-type field effect transistors and first and second sets of field effect transistors which connect the internal switching nodes of said cross-coupled transistors to bit-sense lines, the improvement wherein:
   said first and second sets of field effect transistors each comprise a depletion-type field effect transistor and an enhancement-type field effect transistor connected in parallel.

5. A memory cell as in claim 4 wherein said transistors are N-channel.

6. A memory cell as in claim 4 wherein said transistors are formed as a semiconductor integrated circuit.

7. A memory cell as in claim 6 wherein said depletion-enhancement-type transistors connected in parallel share the same source and drain regions in said semiconductor; and
   the channel regions of said transistors are contiguous and share the same gate electrode.

8. A memory cell as in claim 7 wherein said source and drain regions have N-type conductivity and said channel region has different values of conductivity.

* * * * *